(12) United States Patent　　　　　(10) Patent No.:　US 12,620,936 B2

Hassan　　　　　　　　　　　　　　(45) Date of Patent:　　May 5, 2026

(54) MIXER WITH REDUCED LOCAL OSCILLATOR (LO) LEAKAGE

(71) Applicant: QUALCOMM Incorporated, San Diego, CA (US)

(72) Inventor: Muhammad Hassan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/539,862

(22) Filed: Dec. 14, 2023

(65) Prior Publication Data

US 2025/0202429 A1　　Jun. 19, 2025

(51) Int. Cl.
　　*H03D 7/14*　　　　(2006.01)
　　*H03F 3/45*　　　　(2006.01)

(52) U.S. Cl.
　　CPC ....... *H03D 7/1458* (2013.01); *H03F 3/45475* (2013.01); *H03F 2200/294* (2013.01)

(58) Field of Classification Search
　　CPC ........... H03D 7/1458; H03D 2200/009; H03D 7/1491; H03D 7/1441; H03F 3/45475; H03F 2200/294
　　See application file for complete search history.

(56) References Cited

U.S. PATENT DOCUMENTS

| | | | |
|---|---|---|---|
| 2006/0014509 A1 | 1/2006 | Xu et al. | |
| 2007/0281656 A1* | 12/2007 | Rostami | H03D 7/1458 |
| | | | 455/323 |
| 2009/0179695 A1* | 7/2009 | Siprak | H03D 7/1458 |
| | | | 327/551 |

OTHER PUBLICATIONS

International Search Report and Written Opinion—PCT/US2024/055543—ISA/EPO—Mar. 10, 2025.

* cited by examiner

*Primary Examiner* — Regis J Betsch
*Assistant Examiner* — Amit R Bhatia
(74) *Attorney, Agent, or Firm* — Loza & Loza LLP

(57)　　　ABSTRACT

A mixer includes a mixing stage, and a first transistor and a second transistor coupled to the mixing stage. A gate of the first transistor is coupled to a first input of the mixer, and a gate of the second transistor is coupled to a second input of the mixer. The mixer also includes a first source resistor coupled to a source of the first transistor, and a second source resistor coupled to a source of the second transistor. The mixer further includes an amplifier having a first input coupled to the source of the first transistor, and a second input coupled to the source of the second transistor. The amplifier is configured to adjust at least one bias voltage of at least one of the first transistor and the second transistor based on a differential voltage between the first and second inputs of the amplifier.

10 Claims, 13 Drawing Sheets

1300

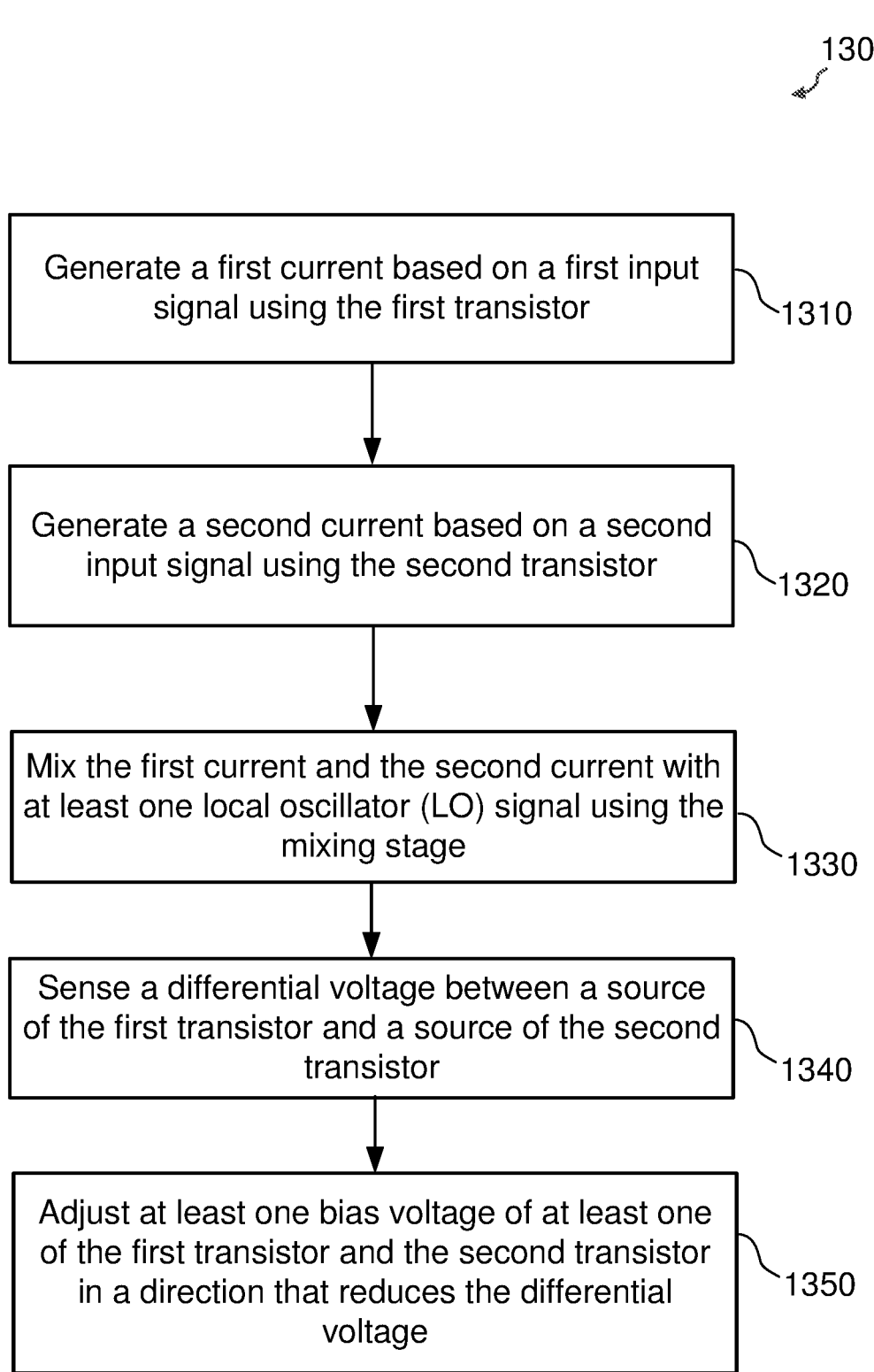

Generate a first current based on a first input signal using the first transistor          1310

Generate a second current based on a second input signal using the second transistor          1320

Mix the first current and the second current with at least one local oscillator (LO) signal using the mixing stage          1330

Sense a differential voltage between a source of the first transistor and a source of the second transistor          1340

Adjust at least one bias voltage of at least one of the first transistor and the second transistor in a direction that reduces the differential voltage          1350

FIG. 13

MIXER WITH REDUCED LOCAL OSCILLATOR (LO) LEAKAGE

FIELD

Aspects of the present disclosure relate generally to wireless communications, and, more particularly, to mixers.

BACKGROUND

A wireless device may transmit and receive radio frequency (RF) signals in one or more wireless networks (e.g., long-term evolution (LTE) network, fifth generation (5G) network, wireless local area network (WLAN), etc.). A wireless device typically includes mixers for performing frequency up-conversion and frequency down-conversion. For example, the wireless device may include a mixer for frequency up-converting a baseband signal or an intermediate frequency (IF) signal into a radio frequency (RF) signal for transmission.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a mixer. The mixer includes a mixing stage, and a first transistor, wherein a gate of the first transistor is coupled to a first input of the mixer, and a drain of the first transistor is coupled to the mixing stage. The mixer also includes a second transistor, wherein a gate of the second transistor is coupled to a second input of the mixer, and a drain of the second transistor is coupled to the mixing stage. The mixer also includes a first source resistor coupled to a source of the first transistor, and a second source resistor coupled to a source of the second transistor. The mixer also includes an amplifier having a first input and a second input, wherein the first input of the amplifier is coupled to the source of the first transistor, the second input of the amplifier is coupled to the source of the second transistor, and the amplifier is configured to adjust at least one bias voltage of at least one of the first transistor and the second transistor based on a differential voltage between the first input of the amplifier and the second input of the amplifier.

A second aspect relates to a method of operating a mixer. The mixer includes a mixing stage, a first transistor coupled to the mixing stage, and a second transistor coupled to the mixing stage. The method includes generating a first current based on a first input signal using the first transistor, generating a second current based on a second input signal using the second transistor, mixing the first current and the second current with one or more local oscillator (LO) signals using the mixing stage, sensing a differential voltage between a source of the first transistor and a source of the second transistor, and adjusting at least one bias voltage of at least one of the first transistor and the second transistor in a direction that reduces the differential voltage.

BRIEF DESCRIPTION OF THE DRA WINGS

FIG. 13 is a flowchart illustrating a method for operating a mixer according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
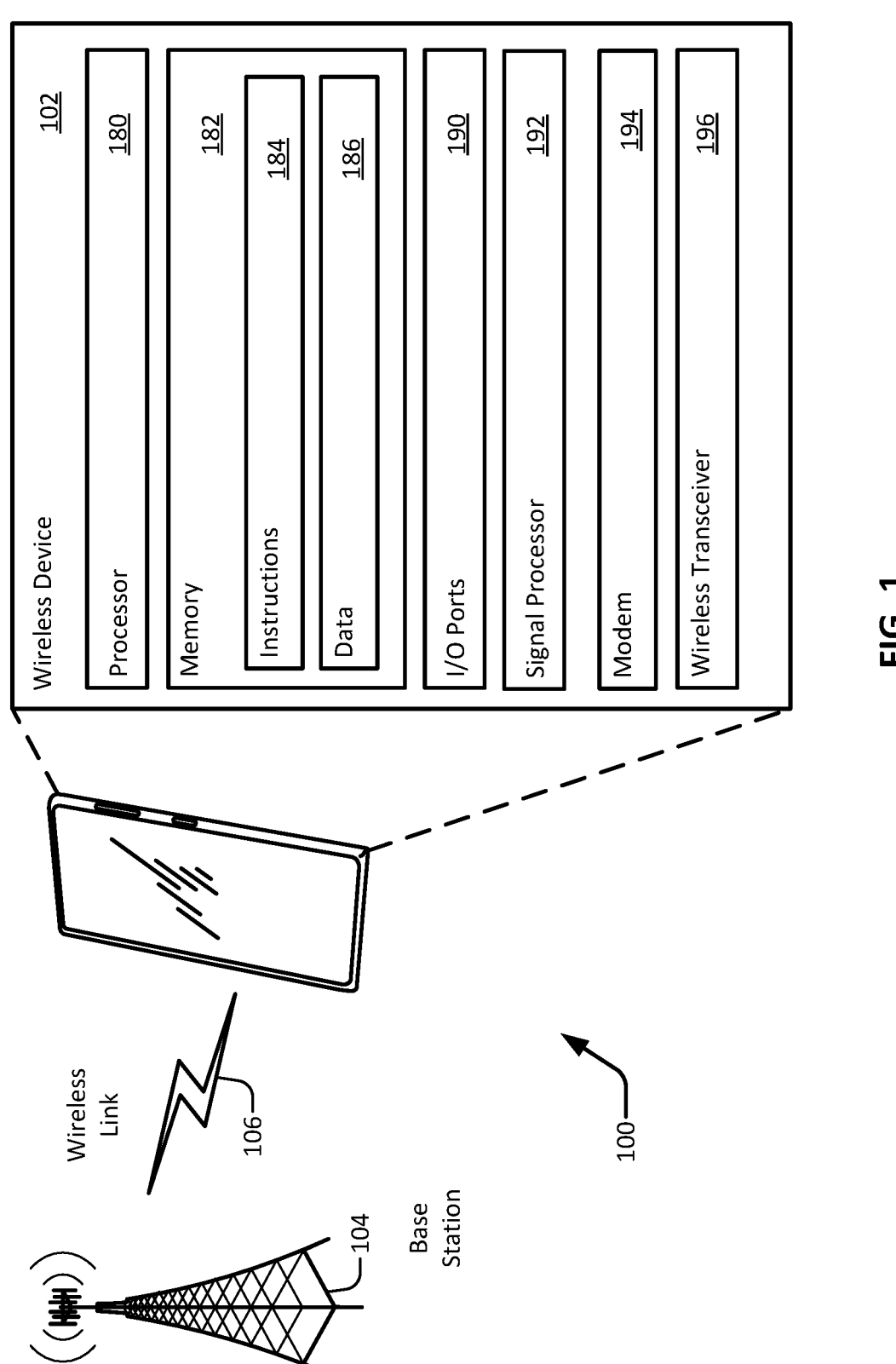
FIG. 1 shows diagram of an example of an environment including a wireless device that includes a transceiver according to certain aspects of the present disclosure.

FIG. 1 is a diagram of an environment 100 that includes a wireless device 102 and a base station 104. In the environment 100, the wireless device 102 communicates with the base station 104 via a wireless link 106. As shown, the wireless device 102 is depicted as a smart phone. However, it is to be understood that the wireless device 102 may be implemented as any suitable wireless device, such as a cellular base station, a broadband router, an access point, a cellular or mobile phone, a gaming device, a navigation device, a media device, a laptop computer, a desktop computer, a tablet computer, a server computer, a network-attached storage (NAS) device, a smart appliance, a vehicle-based communication system, an Internet of Things (IoT) device, a sensor or security device, an asset tracker, and so forth.

The base station 104 communicates with the wireless device 102 via the wireless link 106, which may be implemented as any suitable type of wireless link. Although depicted as a base station tower of a cellular radio network, the base station 104 may represent or be implemented as another device, such as a satellite, a terrestrial broadcast tower, an access point, a peer-to-peer device, a mesh network node, and so forth. The wireless link 106 may include a downlink of data and/or control information communicated from the base station 104 to the wireless device 102 and an uplink of other data and/or control information communicated from the wireless device 102 to the base station 104. The wireless link 106 may be implemented using any suitable communication protocol or standard, such as 3rd Generation Partnership Project Long-Term Evolution (3GPP LTE, 3GPP NR 5G), IEEE 102.11, IEEE 102.11, Bluetooth™, and so forth.

The wireless device 102 includes a processor 180 and a memory 182. The memory 182 may be or form a portion of a computer readable storage medium. The processor 180 may include any type of processor, such as an application processor or a multi-core processor, that is configured to execute processor-executable instructions stored in the memory 182. The memory 182 may include any suitable type of data storage media, such as a volatile memory (e.g., random access memory (RAM)), a non-volatile memory (e.g., Flash memory), an optical media, a magnetic media (e.g., disk or tape), or any combination thereof. In the context of this disclosure, the memory 182 may store instructions 184, data 186, and other information of the wireless device 102.

The wireless device 102 may also include input/output (I/O) ports 190. The I/O ports 190 enable data exchanges or interaction with other devices, networks, or users or between components of the wireless device 102.

The wireless device 102 may further include a signal processor (SP) 192 (e.g., such as a digital signal processor (DSP)). The signal processor 192 may function similar to the processor 180 and may be capable of executing instructions and/or processing information in conjunction with the memory 182.

For communication purposes, the wireless device 102 also includes a modem 194 (e.g., baseband processor), a wireless transceiver 196, and one or more antennas. The wireless transceiver 196 provides connectivity to respective networks (e.g., the base station 104) and other wireless devices connected therewith using RF signals. The wireless transceiver 196 may facilitate communication over any suitable type of wireless network, such as a wireless local area network (LAN) (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 2:
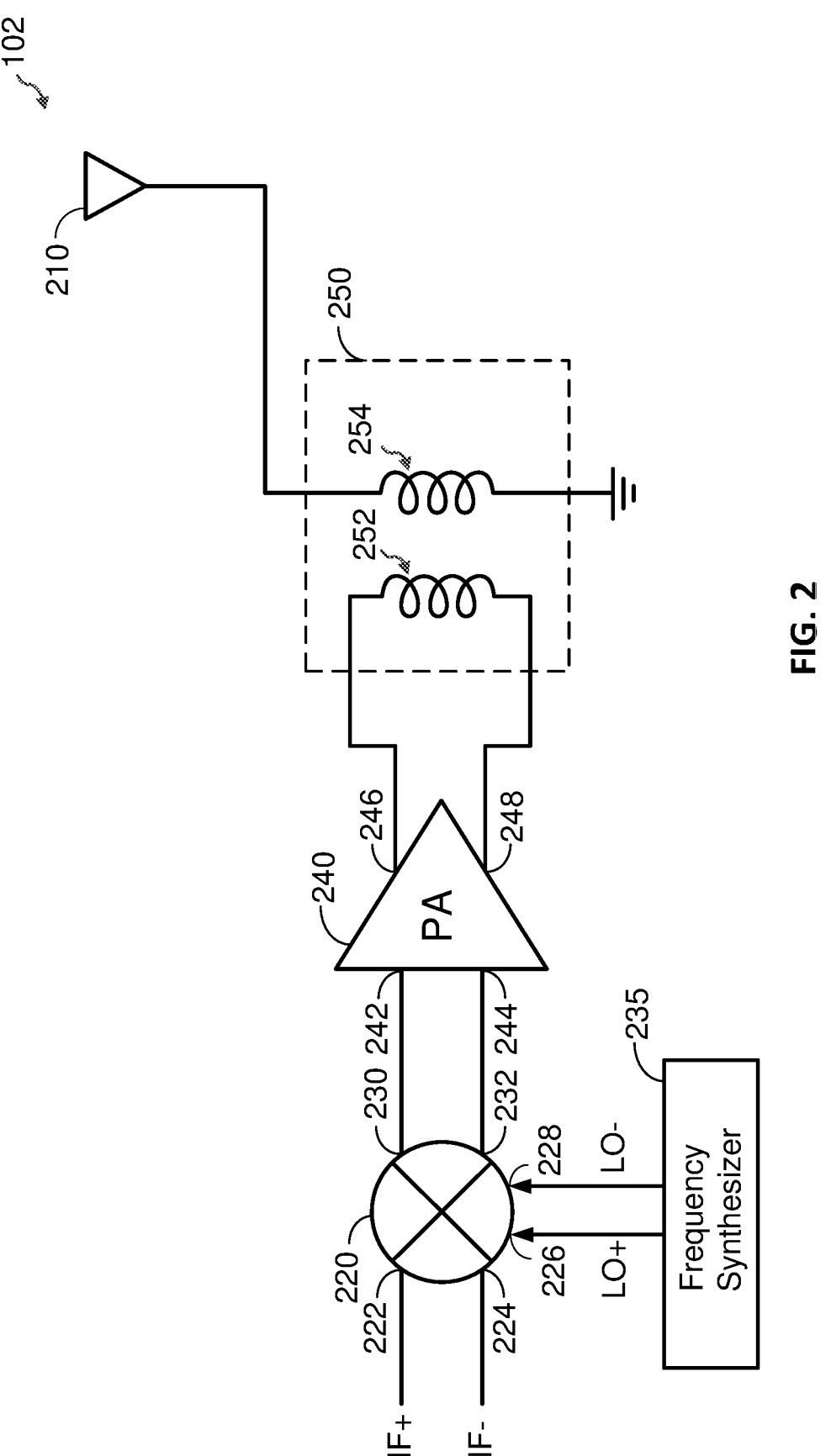
FIG. 2 shows an example in which the wireless device includes a mixer and a power amplifier according to certain aspects of the present disclosure.

FIG. 2 shows an example in which the wireless transceiver 196 of the wireless device 102 includes a mixer 220 and a power amplifier 240. The wireless device 102 may also include an antenna 210 and a transformer 250 coupling the power amplifier 240 to the antenna 210, as discussed further below.

In the example shown in FIG. 2, the mixer is a differential mixer including a first input 222, a second input 224, a third input 226, a fourth input 228, a first output 230, and a second output 232. The first input 222 and the second input 224 are configured to receive a differential input signal that is to be frequency up-converted by the mixer 220. In the example shown in FIG. 2, the differential input signal is a differential intermediate frequency (IF) signal including a first input signal IF+ input to the first input 222 and a second input signal IF− input to the second input 224. However, it is to be appreciated that the present disclosure is not limited to this example. For example, in other implementations, the differential input signal may be a differential baseband signal.

The third input 226 and the fourth input 228 are configured to receive a differential local oscillator (LO) signal. In the example shown in FIG. 2, the differential LO signal includes a first signal LO+ input to the third input 226 and a second signal LO− input to the fourth input 228. The differential LO signal may be generated by a frequency synthesizer 235 coupled to the third input 226 and the fourth input 228. The frequency synthesizer 235 may be implemented with a phase locked loop (PLL) in some implementations.

The mixer 220 is configured to mix the differential input signal (e.g., differential IF signal) with the differential LO signal to frequency un-convert the differential input signal into a differential radio frequency (RF) signal. The differential RF signal includes a first RF signal output from the first output 230 and a second RF signal output from the second output 232.

The power amplifier 240 includes a first input 242, a second input 244, a first output 246, and a second output 248. The first input 242 may be coupled to the first output 230 of the mixer 220, and the second input 244 is coupled to the second output 232 of the mixer 220. The power amplifier 240 is configured to receive the differential RF signal at the first input 242 and the second input 244, amplify the differential RF signal, and output the resulting amplified differential RF signal at the first output 246 and the second output 248.

The transformer 250 includes a first inductor 252 and a second inductor 254 magnetically (i.e., inductively) coupled to one another. The first inductor 252 is coupled between the first output 246 and the second output 248 of the power amplifier 240. In some implementations, the first inductor 252 may have a center tap (not shown) coupled to a supply rail. The second inductor 254 is coupled between the antenna 210 and a ground (or some reference potential). The transformer 250 may be configured to provide impedance matching between the differential output of the power amplifier 240 and the antenna 210. The transformer 250 may also be configured to transform the amplified differential RF signal received from the power amplifier 240 into a single-ended RF signal for transmission by the antenna 210.

Although one power amplifier 240 and one antenna 210 are shown in FIG. 2, it is to be appreciated that the wireless transceiver 196 may include multiple power amplifiers and multiple antennas (e.g., arranged in an array). It is also to be appreciated that the wireless transceiver 196 may include one or more additional components not shown in FIG. 2. For example, in some implementations, the wireless transceiver 196 may include a phase shifter between the mixer 220 and the power amplifier 240. In other example, the wireless transceiver 196 may include a second mixer (not shown) coupled to the power amplifier 240. In this example, the mixer 220 shown in FIG. 2 and the second mixer (not shown) may implement in-phase/quadrature (I/Q) mixers in which the second mixer receives a differential LO signal that is 90 degrees output of phase with the differential LO signal input to the mixer 220 to generate in-phase and quadrature RF signals. However, it is to be appreciated that the present disclosure is not limited to the above example.

In certain aspects, the power amplifier 240 may be configured to transmit RF signals in the millimeter wave (mm-Wave) band, which supports high data rates. Operating in the mmWave band allows the use of small antennas, which allow the wireless device 102 to employ one or more antenna arrays (e.g., for high directivity and antenna gain). However, it is to be appreciated that the present disclosure is not limited to the mmWave band, and that the wireless transceiver 196 may transmit in other frequency bands. The wireless transceiver 196 may be used to transmit signals in the frequency range 1 (FR1) and/or the frequency range 2 (FR2).

Figure 3:
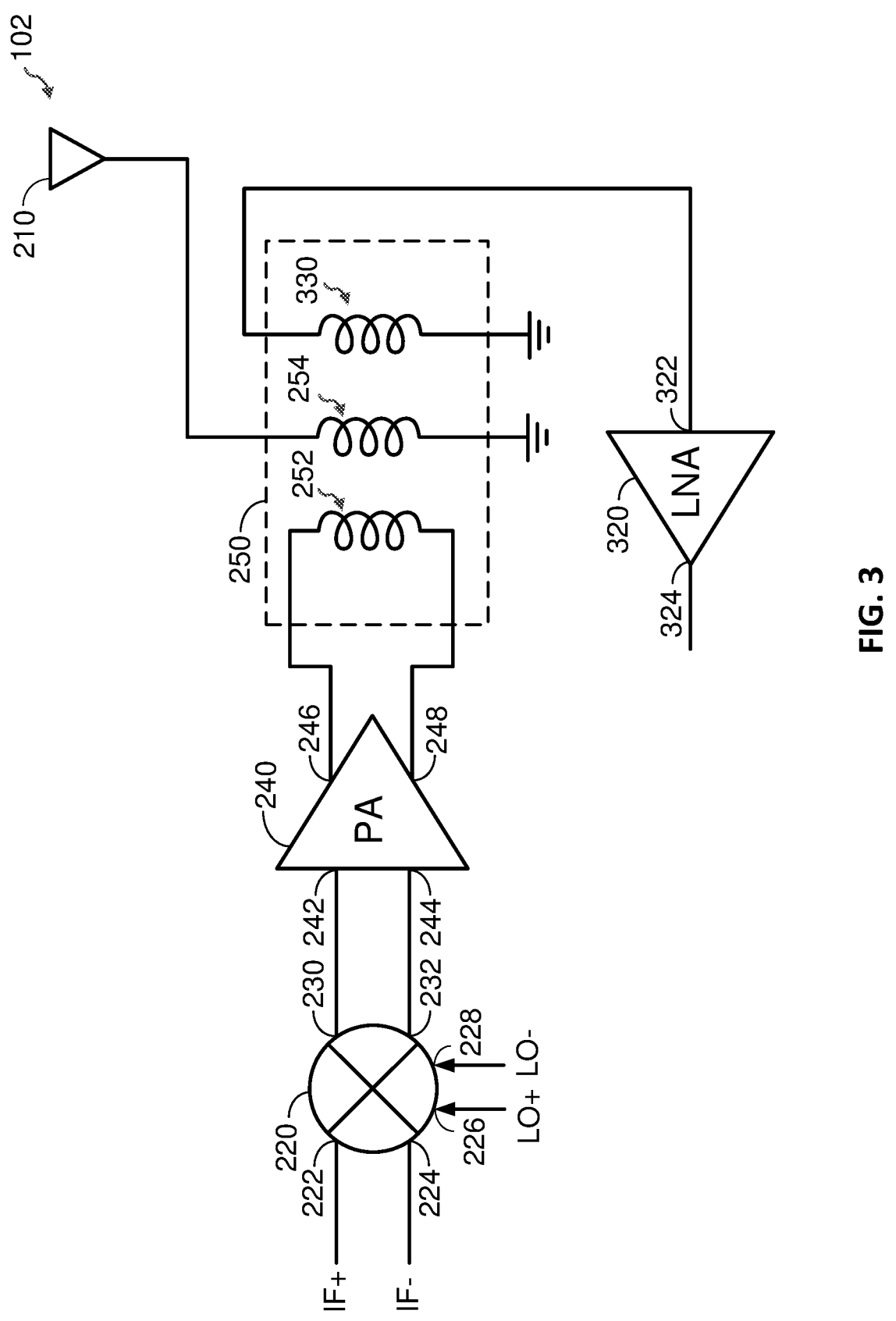
FIG. 3 shows an example in which the wireless device also includes a low-noise amplifier according to certain aspects of the present disclosure.

FIG. 3 shows an example in which the wireless transceiver 196 also includes a low-noise amplifier 320. The low-noise amplifier 320 includes an input 322 and an output 324. The low-noise amplifier 320 is configured to amplify an RF signal received via the antenna 210, as discussed further below.

In the example in FIG. 3, the transformer 250 includes a third inductor 330 coupled between the input 322 of the low-noise amplifier 320 and ground (or some reference potential). The third inductor 330 is magnetically (i.e., inductively) coupled to the second inductor 254. In this example, the magnetic coupling between the second inductor 254 and the third inductor 330 couples an RF signal received from the antenna 210 to the input 322 of the low-noise amplifier 320. The low-noise amplifier 320 receives the RF signal at the input 322, amplifies the received RF signal, and outputs the amplified RF signal at the output 324. The output 324 of the low-noise amplifier 320 may be coupled to a mixer (not shown) for frequency down-converting the amplified RF signal, a phase shifter (not shown), and/or one or more other circuits in the wireless transceiver 196.

It is also to be appreciated that the wireless transceiver 196 may include one or more additional components not shown in FIG. 3. For example, in some implementations, the wireless transceiver 196 may include an impedance matching network (not shown) coupled to the input 322 of the low-noise amplifier 320. It is also to be appreciated that the present disclosure is not limited to the exemplary transformer 250 shown in FIG. 3. For example, in some implementations, the low-noise amplifier 320 and the power amplifier 240 may be coupled to the antenna 210 via a duplexer, a diplexer, switches, and so forth.

Figure 4:
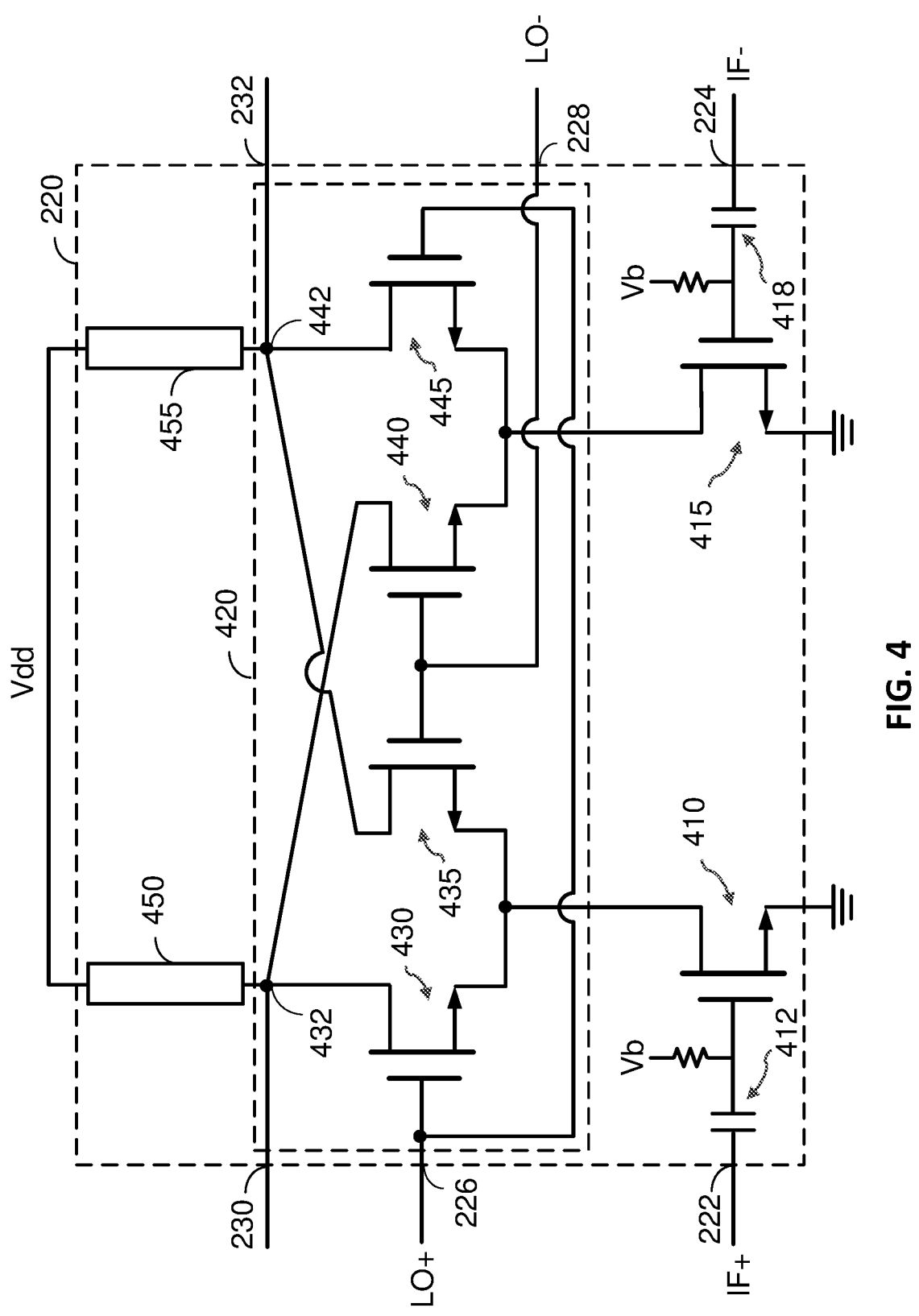
FIG. 4 shows an exemplary implementation of a mixer according to certain aspects of the present disclosure.

FIG. 4 shows an exemplary implementation of the mixer 220 according to certain aspects. In this example, mixer 220 is implemented with a double balanced mixer including a first transistor 410 and a second transistor 415. The gate of the first transistor 410 is coupled to the first input 222 through a first coupling capacitor 412, and the gate of the second transistor 415 is coupled to the second input 224 through a second coupling capacitor 418. The gates of the first transistor 410 and the second transistor 415 are biased by bias voltage Vb, which may be provided by a bias circuit (not shown).

The first transistor 410 and the second transistor 415 are configured to convert the voltages of the input signals at the inputs 222 and 224, respectively, into currents. Although the input signals are shown as IF signals IF+ and IF− in the example in FIG. 4, it is to be appreciated that the input signals may be baseband signals in some implementations. In this example, the transistors 410 and 415 may also be referred to as transconductance devices or Gm devices since the transistors 410 and 415 are used to provide transconductance in this example.

The mixer 220 includes a mixing stage 420 driven by the LO signals LO+ and LO− at the third input 226 and the fourth input 228, respectively. The drain of the first transistor 410 and the drain of the second transistor 415 are coupled to the mixing stage 420. In the example shown in FIG. 4, the mixing stage 420 includes a third transistor 430, a fourth transistor 435, a fifth transistor 440, and a sixth transistor 445.

The gate of the third transistor 430 is coupled to the third input 226, the gate of the fourth transistor 435 is coupled to the fourth input 228, the gate of the fifth transistor 440 is coupled to the fourth input 228, and the gate of the sixth transistor 445 is coupled to the third input 226. Thus, in this example, the gates of the third transistor 430 and the sixth transistor 445 are driven by the LO signal LO+ and the gates of the fourth transistor 435 and the fifth transistor 440 are driven by the LO signal LO−. The sources of the third transistor 430 and the fourth transistor 435 are coupled to the drain of the first transistor 410, and the sources of the fifth transistor 440 and the sixth transistor 445 are coupled to the drain of the second transistor 415. The drains of the third transistor 430 and the fifth transistor 440 are coupled to a first node 432, and the drains of the fourth transistor 435 and the sixth transistor 445 are coupled to a second node 442.

As discussed above, the gates of the third transistor 430 and the sixth transistor 445 are driven by the LO signal LO+ and the gates of the fourth transistor 435 and the fifth transistor 440 are driven by the LO signal LO−. In certain aspects, the third transistor 430, the fourth transistor 435, the fifth transistor 440, and the sixth transistor 445 are used as switching transistors that are driven by the LO signals LO+ and LO−, which mixes the currents from the first and transistors 410 and 415 with the LO signals LO+ and LO−.

In the example in FIG. 4, the mixer 220 also includes a first load 450 and a second load 455. The first load 450 is coupled between the first node 432 and a supply rail that provides a supply voltage Vdd. The second load 455 is coupled between the second node 442 and the supply rail. Each of the loads 450 and 455 may include a respective inductor and/or a respective resistor. In the example in FIG. 4, the first output 230 of the mixer 220 is coupled to the first node 432, and the second output 232 of the mixer 220 is coupled to the second node 442. However, it is to be appreciated that the present disclosure is not limited to this example.

Figure 5:
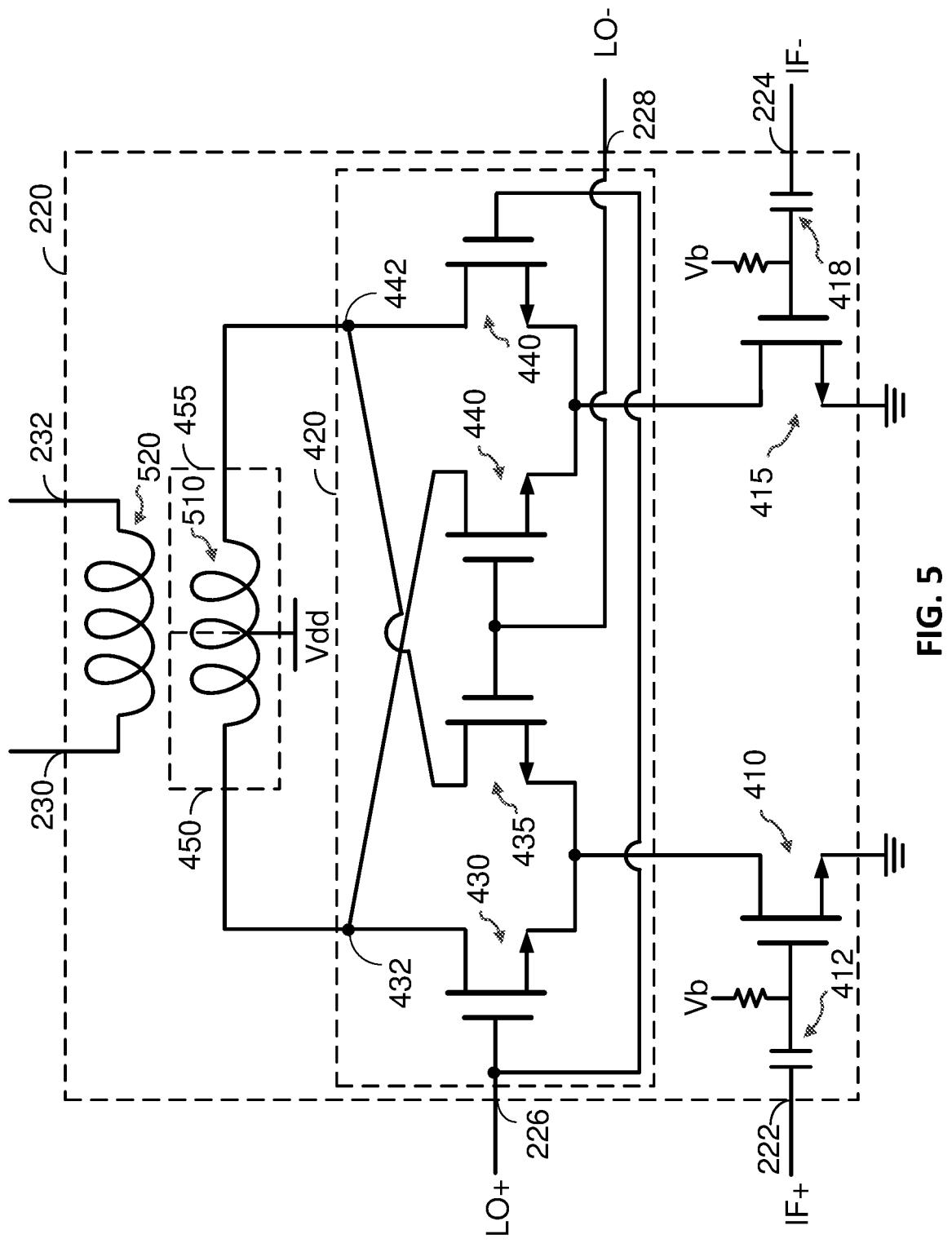
FIG. 5 shows an example in which the mixer of FIG. 4 includes inductive loads according to certain aspects of the present disclosure.

FIG. 5 shows an example in which the mixer 220 includes a first inductor 510 and a second inductor 520 magnetically (i.e., inductively) coupled to one another. The first inductor 510 is coupled between the first node 432 and the second node 442, and the second inductor 520 is coupled between the first output 230 and the second output 232. In this example, the first inductor 510 has a center tap coupled to the supply rail, in which a first portion of the first inductor 510 between the first node 432 and the center tap corresponds to the first load 450, and a second portion of the first inductor 510 between the center tap and the second node 442 corresponds to the second load 455. In this example, the first load 450 and the second load 455 are inductive loads.

The mixer 220 may suffer from LO leakage, which occurs when a small amount of the differential LO signal leaks (i.e., feds through) to the outputs 232 and 234 of the mixer 220, which degrades the differential RF signal. The double balanced design of the exemplary mixer 220 reduces the LO leakage. However, the LO signal reduction relies on the transconductances of the first transistor 410 and the second transistor 415 being matched, which is often not the case (e.g., due to mismatch between the transistors 410 and 415). To address this, some approaches use a power detector located at the output of the power amplifier or an unused receiver to detect power at the LO frequency (i.e., LO tone), and a bias circuit to adjust bias voltages (e.g., Vb) of the mixer 220 in a direction that reduces the detected power at the LO frequency. However, these approaches work offline and may have relatively long test time penalties.

To address the above, aspects of the present disclosure provide a circuit capable of reducing transconductance mismatch between the first and second transistors 410 and 415 to reduce LO leakage while the mixer 220 is working (i.e., online). In certain aspects, the circuit includes source degeneration resistors coupled to the sources of the first and second transistors 410 and 415, and an amplifier configured to sense a differential voltage between the sources of the first and second transistors 410 and 415, and adjust one or more bias voltages of the first and second transistors 410 and 415 in a direction that reduces the differential voltage between the sources. This reduces the transconductance mismatch between the first and second transistors 410 and 415, thereby reducing the LO leakage, as discussed further below. The above features and other features according to aspects of the present disclosure are discussed further below.

Figure 6:
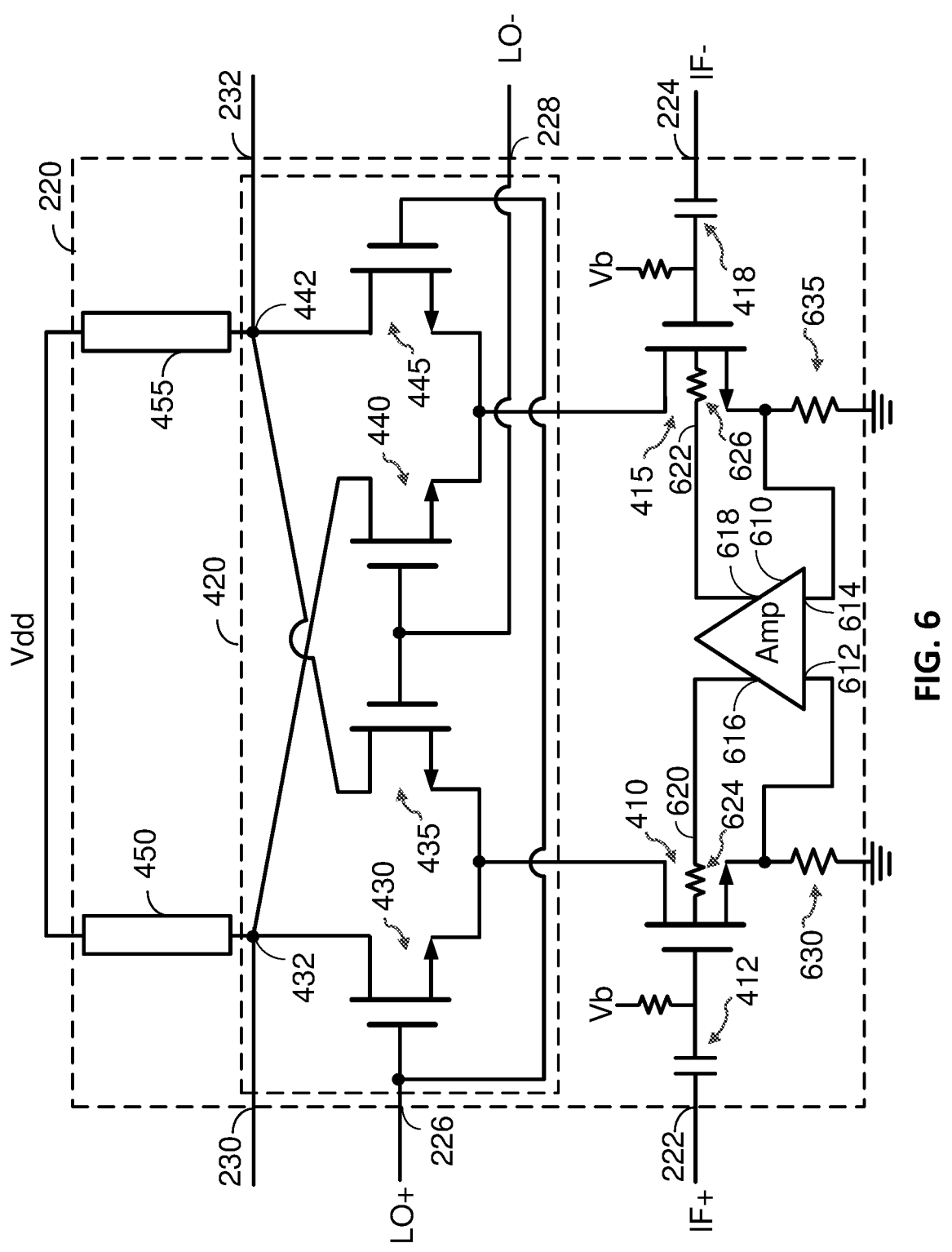
FIG. 6 shows an example of a mixer including source resistors and an amplifier according to certain aspects of the present disclosure.

FIG. 6 shows an exemplary implementation of the mixer 220 according to certain aspects. In this example, the mixer 220 includes a first source resistor 630 and a second source resistor 635 (e.g., to improve the linearity of the mixer 220). The first source resistor 630 is coupled between the source of the first transistor 410 and ground (or some reference potential), and the second source resistor 635 is coupled between the source of the second transistor 415 and ground (or some reference potential). In certain aspects, the first source resistor 630 and the second source resistor 635 have approximately the same resistance.

The mixer 220 also includes an amplifier 610 having a first input 612, a second input 614, a first output 616, and a second output 618. The first input 612 of the amplifier 610 is coupled to the source of the first transistor 410, and the second input 614 of the amplifier 610 is coupled to the source of the second transistor 415. The first input 612 may be a plus (i.e., non-inverting) input and the second input 614 may be a minus (i.e., inverting) input, or vice versa.

In this example, the first output 616 is coupled to a back gate 620 of the first transistor 410, and the second output 618 is coupled to a back gate 622 of the second transistor 415. The first output 616 may be a plus (i.e., non-inverting) output and the second output 618 may be a minus (i.e., inverting) output, or vice versa. The back gate 620 and 622 of each of the transistors 410 and 415 may be coupled to a body of the transistor (e.g., substrate). In this example, each back gate 620 and 622 may also be referred to as the body. For a silicon-on-insulator implementation of the transistors 410 and 415, each of the transistors 410 and 415 may include a thin buried oxide between the channel of the transistor and the respective back gate 620 and 622. In certain aspects, resistors 624 and 626 may be coupled to the back gates 620 and 622, respectively, to float the back gates 620 and 624 for better AC performance.

In this example, the first output 616 of the amplifier 610 provides a first bias voltage for the back gate 620 of the first transistor 410, and the second output 618 of the amplifier 610 provides a second bias voltage for the back gate 622 of the second transistor 415. Thus, in this example, the amplifier 610 can be used to adjust the bias voltages at the back gates 620 and 622 of the transistors 410 and 415. The bias voltage at the back gate 620 of the first transistor 410 affects the transconductance of the first transistor 410, and bias voltage at the back gate 622 of the second transistor 415 affects the transconductance of the second transistor 415. Thus, the amplifier 610 is able to adjust the transconductances of the transistors 410 and 415 by adjusting the bias voltages at the back gates 620 and 622.

In certain aspects, the amplifier 610 is configured to sense the differential voltage between the sources of the first and second transistors 410 and 415 at the inputs 612 and 614, and adjust the bias voltages at the back gates 620 and 622 of the first and second transistors 410 and 415 in a direction that reduces the differential voltage between the sources. In other words, the amplifier 610 adjusts the bias voltages at the back gates 620 and 622 of the first and second transistors 410 and 415 in a direction that forces the voltages at the sources of the first and second transistors 410 and 415 to be approximately equal. Assuming the source resistors 630 and 635 have equal resistances, the bias currents flowing through the first and second transistors 410 and 415 are approximately equal when the voltages at the sources of the first and second transistors 410 and 415 are approximately equal. Thus, in this example, the amplifier 610 adjusts the bias voltages at the back gates 620 and 622 of the first and second transistors 410 and 415 in a direction that forces the bias currents flowing through the first and second transistors 410 and 415 to be approximately equal. The approximately equal bias currents cause the transconductances of the first and second transistors 410 and 415 to be approximately equal, which reduces LO leakage due to mismatch in the transconductances of the first and second transistors 410 and 415.

In certain aspects, the amplifier 610 may have a low bandwidth that is lower than the frequency of the input signals (e.g., IF signals) at the inputs 222 and 224. This allows the amplifier 610 to force the bias currents of the first and second transistors 410 and 415 to be approximately equal to reduce transconductance mismatch between the first and second transistors 410 and 415 while not affecting the currents generated from the input signals (e.g., IF currents) at the inputs 222 and 224.

Thus, in this example, the amplifier 610 adjusts the voltages at the back gates 620 and 622 of the first and second transistors 410 and 415 in a direction that forces the bias currents of the first and second transistors 410 and 415 to be approximately equal. The approximately equal bias currents cause the transconductances of the first and second transistors 410 and 415 to be approximately equal, which reduces LO leakage due to mismatch in the transconductances of the first and second transistors 410 and 415.

Figure 7:
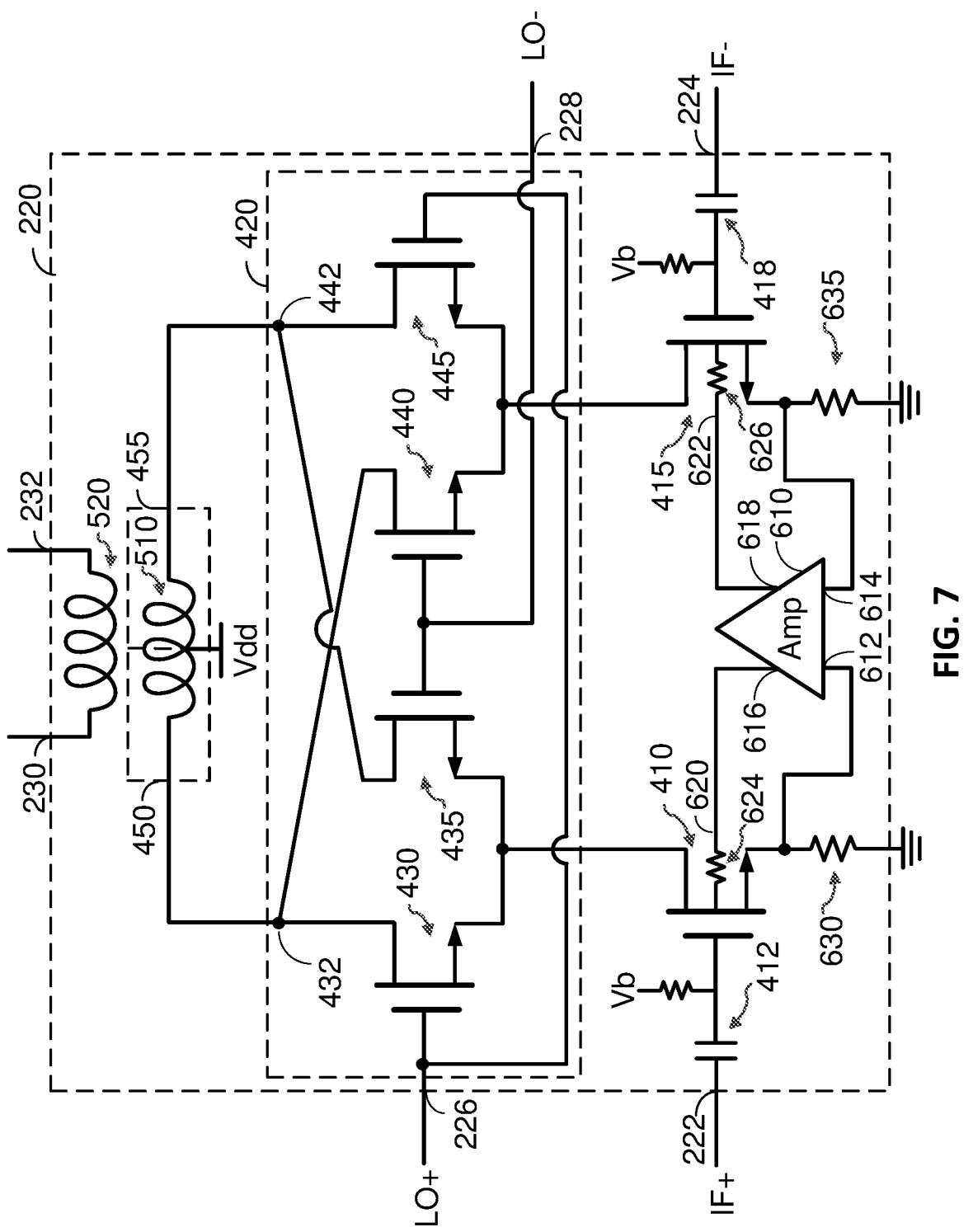
FIG. 7 shows an example of a mixer including inductive loads according to certain aspects of the present disclosure.

FIG. 7 shows an example of the mixer 220 in which the first and second loads 450 and 455 are implemented with the first inductor 510 shown in FIG. 5. In this example, the outputs 230 and 232 of the mixer 220 are provided by the second inductor 520, which is magnetically (i.e., inductively) coupled to the first inductor 510.

Figure 8:
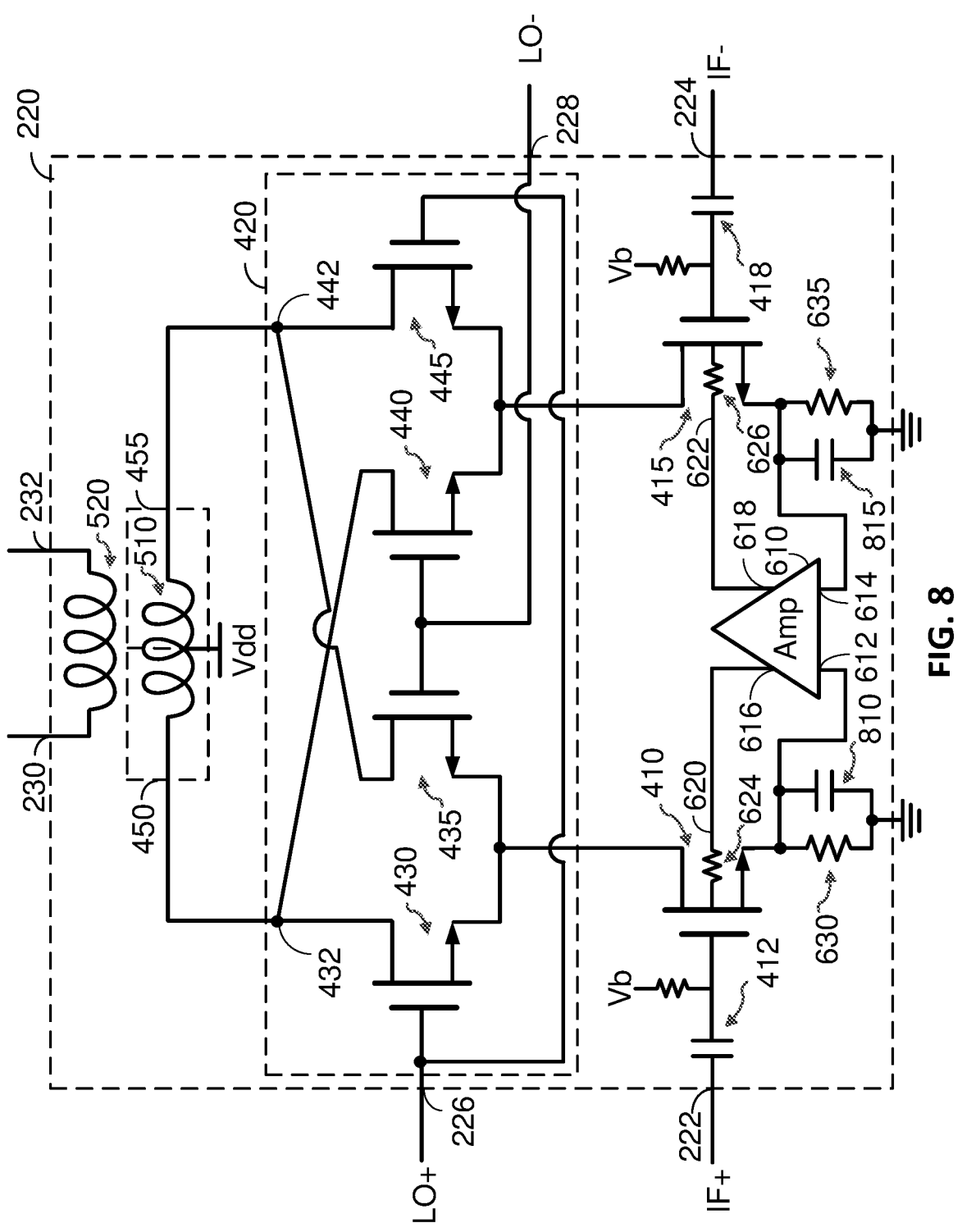
FIG. 8 shows an example of a mixer including source capacitors according to certain aspects of the present disclosure.

FIG. 8 shows an example in which the mixer 220 further includes a first capacitor 810 and a second capacitor 815. The first capacitor 810 is coupled between the source of the first transistor 410 and ground (or some reference potential), and the second capacitor 815 is coupled between the source of the second transistor 415 and ground (or some reference potential). The capacitors 810 and 815 help lower the AC swing at the inputs 612 and 614, which helps keep the resistive degeneration phenomena limited to DC and therefore not impact the mixer gain at high frequency.

Figure 9:
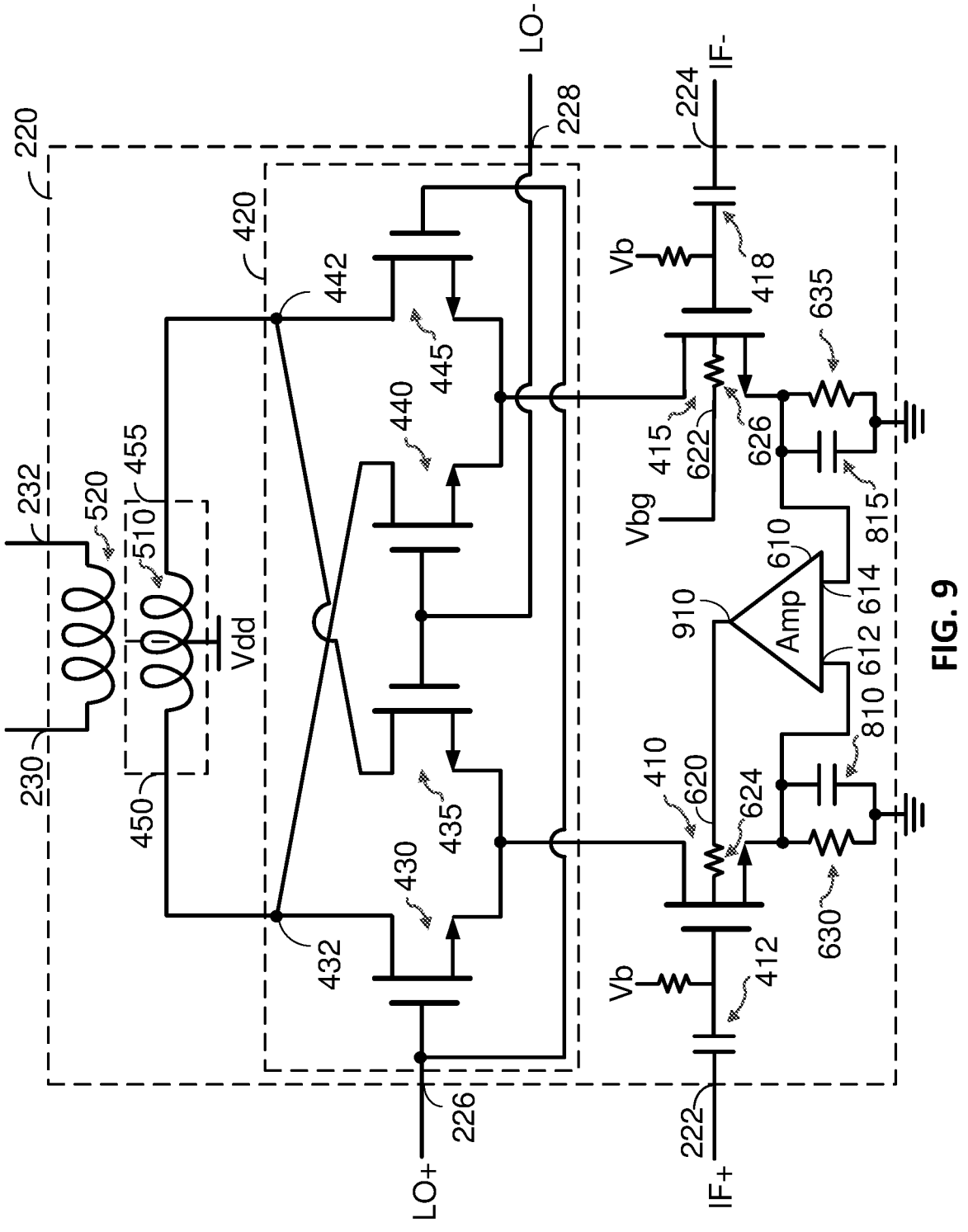
FIG. 9 shows an example of an amplifier including a single-ended output configured to adjust a back gate voltage of a transistor in a mixer according to certain aspects of the present disclosure.

Although the amplifier 610 adjusts the bias voltages at the back gates 620 and 622 of both the first transistor 410 and the second transistor 415 in the examples discussed above, it is to be appreciated that the amplifier 610 is not limited to these examples. In this regard, FIG. 9 shows an example in which the amplifier 610 has a single-ended output 910 coupled to the back gate 620 of the first transistor 410. In this example, the back gate 620 of the second transistor 415 may be biased by a bias voltage Vbg, which may be provided by a bias circuit (not shown). The bias voltage Vbg may be fixed in some implementations.

In this example, the amplifier 610 is configured to sense the differential voltage between the sources of the first and second transistors 410 and 415 at the inputs 612 and 614, and adjust the bias voltage at the back gate 620 of the first transistor 410 in a direction that reduces the differential voltage between the sources. In other words, the amplifier 610 adjusts the bias voltage at the back gate 620 of the first transistor 410 in a direction that forces the voltages at the sources of the first and second transistors 410 and 415 to be approximately equal. Assuming the source resistors 630 and 635 have equal resistances, the bias currents flowing through the first and second transistors 410 and 415 are approximately equal when the voltages at the sources of the first and second transistors 410 and 415 are approximately equal. Thus, in this example, the amplifier 610 adjusts the bias voltage at the back gate 620 of the first transistor 410 in a direction that forces the bias currents flowing through the first and second transistors 410 and 415 to be approximately equal. The approximately equal bias currents cause the transconductances of the first and second transistors 410 and 415 to be approximately equal, which reduces LO leakage due to mismatch in the transconductances of the first and second transistors 410 and 415.

Figure 10:
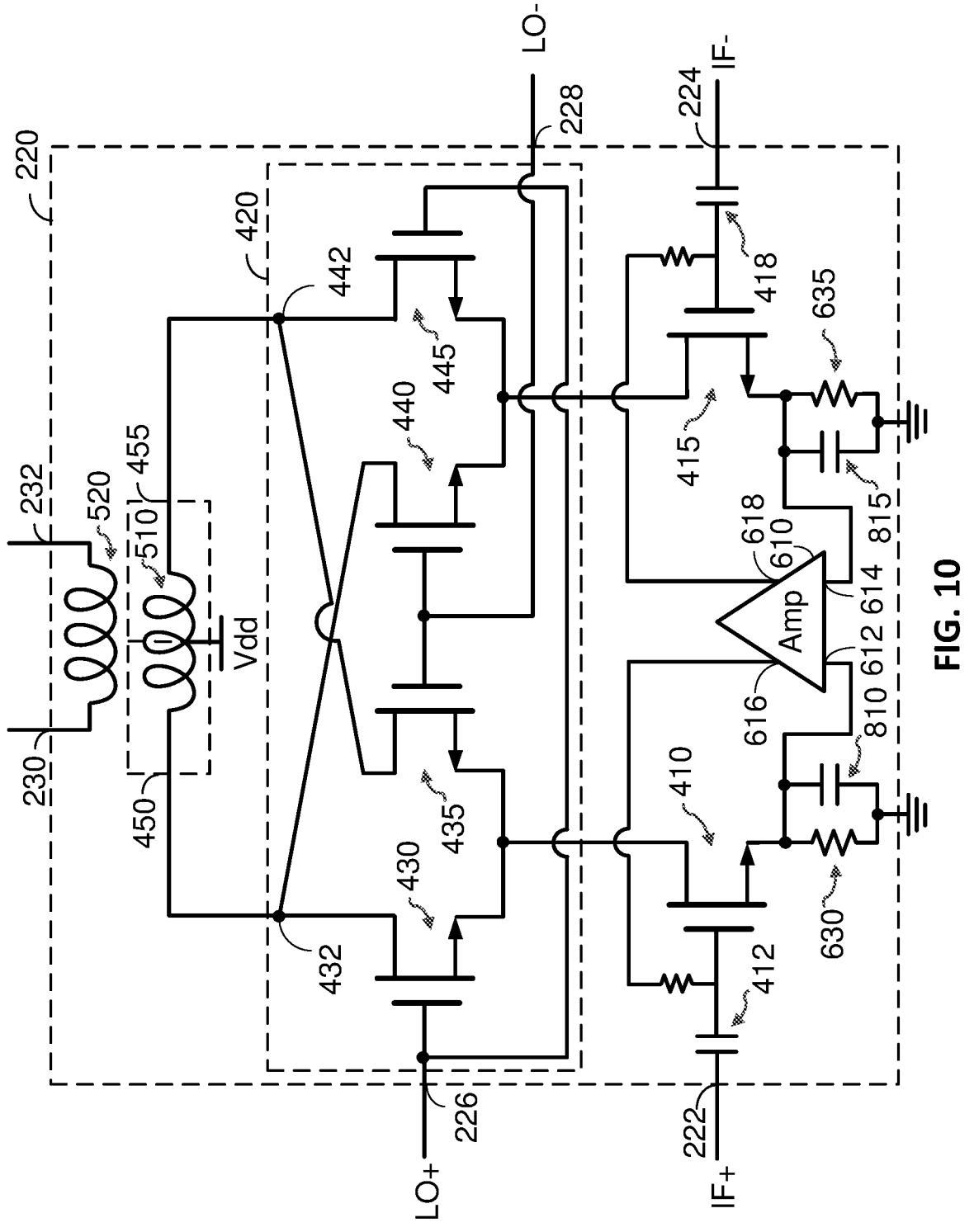
FIG. 10 shows an example of an amplifier configured to adjust gate bias voltage of transistors in a mixer according to certain aspects of the present disclosure.

It is to be appreciated that the amplifier 610 is not limited to adjusting the bias voltages at the back gates 620 and 622 of the first and second transistors 410 and 415. For example, in other implementations, the amplifier 610 may instead adjust the bias voltages at the gates of the first and second transistors 410 and 415. In this regard, FIG. 10 shows an example in which the first output 616 of the amplifier 610 is coupled to the gate of the first transistor 410, and the second output 618 of the amplifier 610 is coupled to the gate of the second transistor 415. In this example, the back gates (not shown in FIG. 10) of the first and second transistors 410 and 415 may be biased by a bias circuit (not shown).

In this example, the first output 616 of the amplifier 610 provides the gate bias voltage for the first transistor 410, and the second output 618 of the amplifier 610 provides the gate bias voltage for the second transistor 415. Thus, in this example, the amplifier 610 can be used to adjust the gate bias voltages of the transistors 410 and 415. Since the gate bias voltages of the first and second transistors 410 and 415 affect the transconductances of the first and second transistors 410 and 415, the amplifier 610 is able to adjust the transconductances of the transistors 410 and 415 by adjusting the gate bias voltages of the first and second transistors 410 and 415.

In certain aspects, the amplifier 610 is configured to sense the differential voltage between the sources of the first and second transistors 410 and 415 at the inputs 612 and 614, and adjust the gate bias voltages of the first and second transistors 410 and 415 in a direction that reduces the differential voltage between the sources. In other words, the amplifier 610 adjusts the gate bias voltages of the first and second transistors 410 and 415 in a direction that forces the voltages at the sources of the first and second transistors 410 and 415 to be approximately equal. Assuming the source resistors 630 and 635 have equal resistances, the bias currents flowing through the first and second transistors 410 and 415 are approximately equal when the voltages at the sources of the first and second transistors 410 and 415 are approximately equal. Thus, in this example, the amplifier 610 adjusts the gate bias voltages of the first and second transistors 410 and 415 in a direction that forces the bias currents flowing through the first and second transistors 410 and 415 to be approximately equal. The approximately equal bias currents cause the transconductances of the first and second transistors 410 and 415 to be approximately equal, which reduces LO leakage due to mismatch in the transconductances of the first and second transistors 410 and 415.

Figure 11:
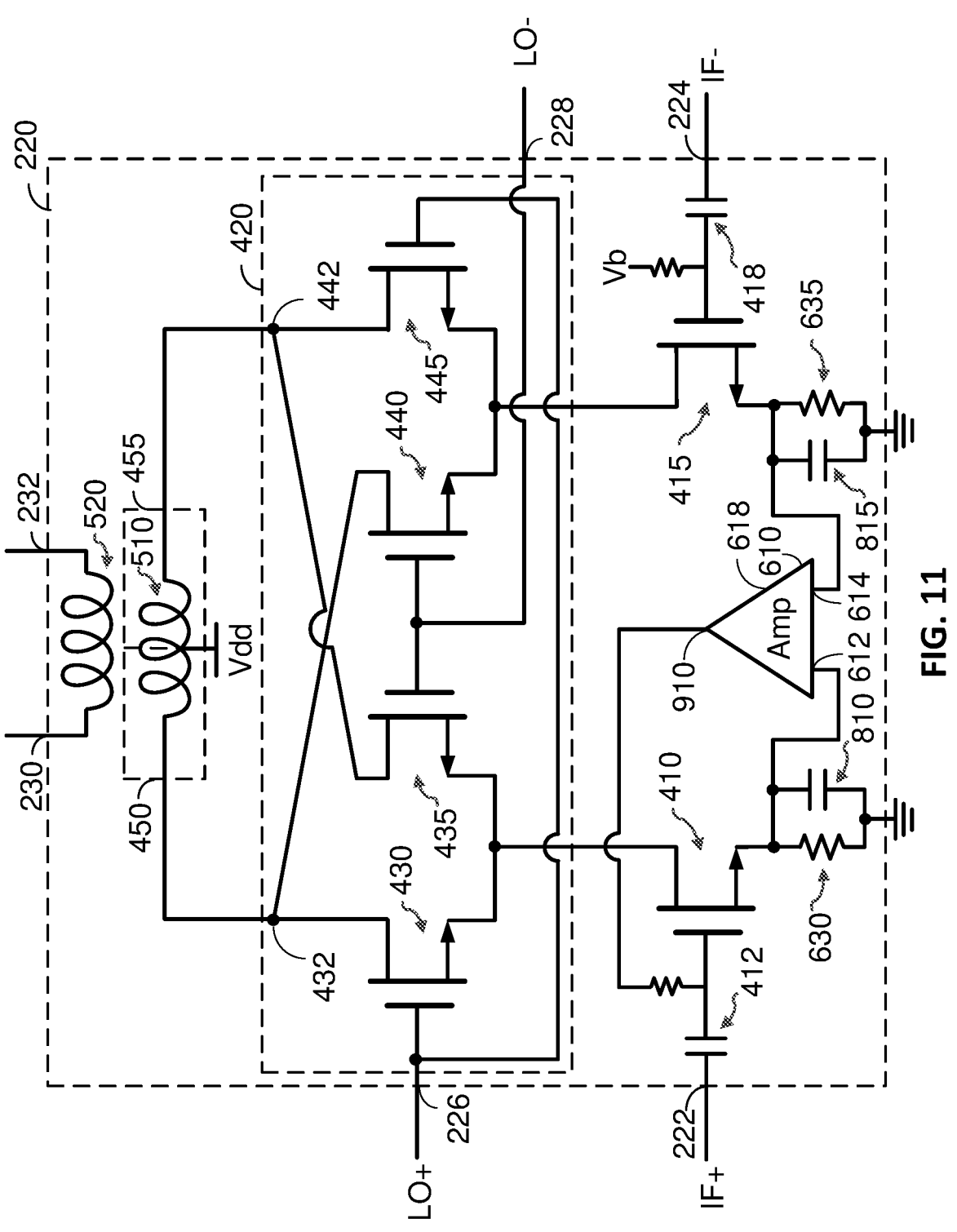
FIG. 11 shows an example of an amplifier including a single-ended output configured to adjust a gate bias voltage of a transistor in a mixer according to certain aspects of the present disclosure.

Although the amplifier 610 adjusts the gate bias voltages of both the first transistor 410 and the second transistor 415 in the example shown in FIG. 10, it is to be appreciated that the amplifier 610 is not limited to this example. In this regard, FIG. 11 shows an example in which the amplifier 610 has the single-ended output 910 coupled to the gate of the first transistor 410. In this example, the gate of the second transistor 415 may be biased by the gate bias voltage Vb, which may be provided by the bias circuit discussed above. The gate bias voltage Vb may be fixed in some implementations.

In this example, the amplifier 610 is configured to sense the differential voltage between the sources of the first and second transistors 410 and 415 at the inputs 612 and 614, and adjust the gate bias voltage of the first transistor 410 in a direction that reduces the differential voltage between the sources. In other words, the amplifier 610 adjusts the gate bias voltage of the first transistor 410 in a direction that forces the voltages at the sources of the first and second transistors 410 and 415 to be approximately equal. Assuming the source resistors 630 and 635 have equal resistances, the bias currents flowing through the first and second transistors 410 and 415 are approximately equal when the voltages at the sources of the first and second transistors 410 and 415 are approximately equal. Thus, in this example, the amplifier 610 adjusts the bias voltage at the gate bias voltage of the first transistor 410 in a direction that forces the bias currents flowing through the first and second transistors 410 and 415 to be approximately equal. The approximately equal bias currents cause the transconductances of the first and second transistors 410 and 415 to be approximately equal, which reduces LO leakage due to mismatch in the transconductances of the first and second transistors 410 and 415.

Figure 12:
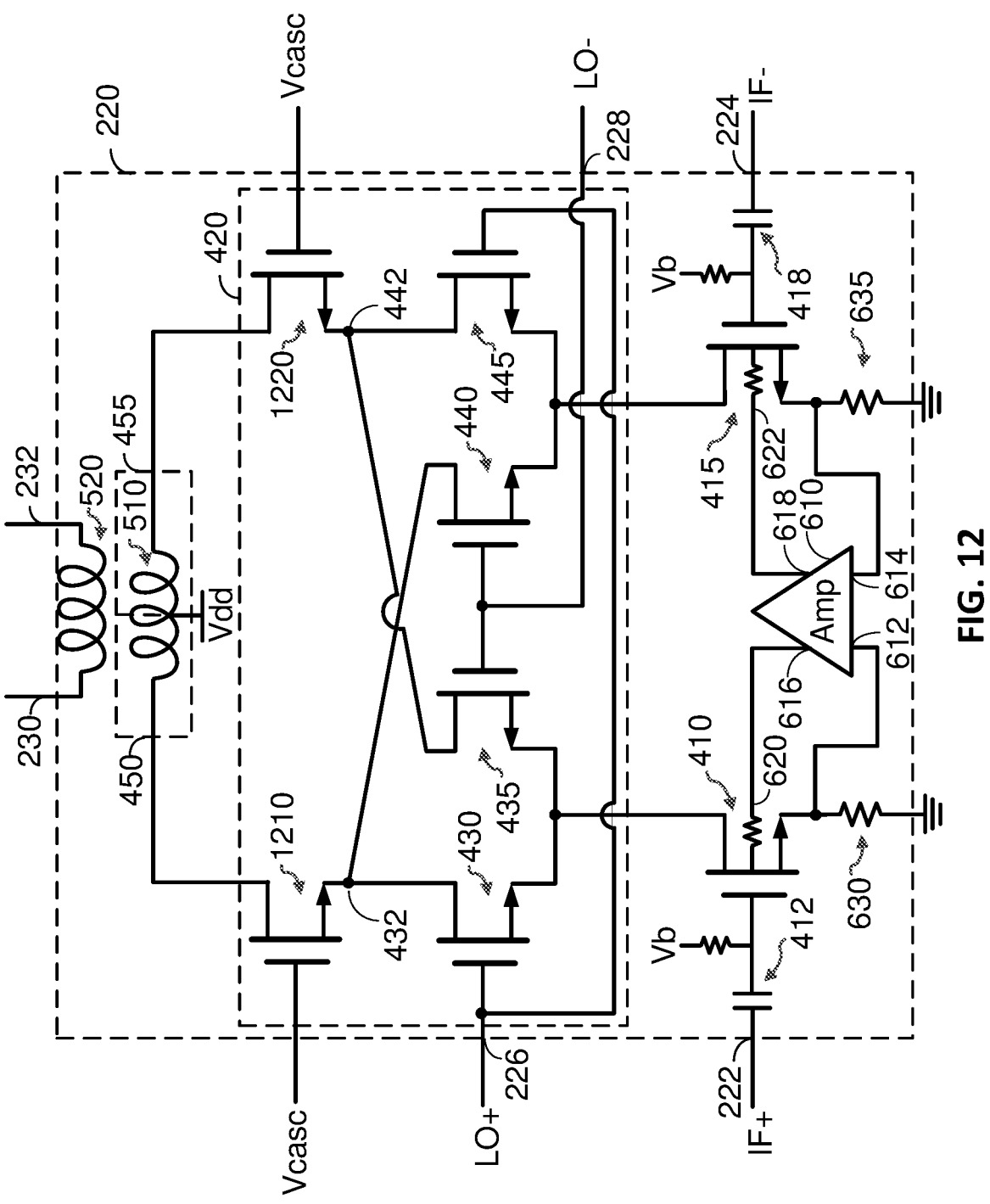
FIG. 12 shows an example of a mixer including cascode transistors according to certain aspects of the present disclosure.

FIG. 12 shows an example in which the mixing stage 420 further includes a first cascode transistor 1210 and a second cascode transistor 1220. The drain of the first cascode transistor 1210 is coupled to the first load 450, the gate of the first cascode transistor 1210 is biased by bias voltage Vcasc, and the source of the first cascode transistor 1210 is coupled to the drain of the third transistor 430. The drain of the second cascode transistor 1220 is coupled to the second load 455, the gate of the second cascode transistor 1220 is biased by the bias voltage Vcasc, and the source of the second cascode transistor 1220 is coupled to the drain of the sixth transistor 445. In this example, the supply voltage Vdd may be higher to provide additional headroom for the cascode transistors 1210 and 1220.

The exemplary cascode configuration shown in FIG. 12 may be used, for example, when the supply voltage Vdd is set high (e.g., to increase the headroom of the mixer 220). For example, in a deeply-scaled process, if a small supply voltage Vdd is used, then the source resistors 630 and 635 may eat up too much of the headroom from the transistors 410 and 430 and hence limit the linearity. In these cases, changing to a higher Vdd may be an attractive alternative option. However, the transistors 430, 435, 440, and 445 (e.g., core devices) may not be able to sustain the higher supply voltage Vdd due to device reliability limitations. In this case, the cascode transistors 1210 and 1220 reduce the voltage stress on the transistors 430, 435, 440, and 445 from the higher Vdd. Since the cascode transistors 1210 and 1220 are not driven by LO signals, the cascode transistors 1210 and 1220 can have thick gate oxides, which allow the cascode transistors 1210 and 1220 to tolerate higher voltages.

FIG. 13 illustrates a method 1300 of operating a mixer according to certain aspects. The mixer (e.g., mixer 220) includes a mixing stage (e.g., mixing stage 420), a first transistor (e.g., first transistor 410) coupled to the mixing stage, and a second transistor (e.g., second transistor 415) coupled to the mixing stage.

At block 1310, a first current is generated based on a first input signal using the first transistor. The first input signal may correspond to the first IF signal IF+ or another signal.

At block 1320, a second current is generated based on a second input signal using the second transistor. The second input signal may correspond to the second IF signal IF− or another signal.

At block 1330, the first current and the second current are mixed with one or more local oscillator (LO) signals using the mixing stage. The one or more LO signal may include the first LO signal LO+ and the second LO signal LO−.

At block 1340, a differential voltage is sensed between a source of the first transistor and a source of the second transistor. For example, the differential voltage may be sensed by the amplifier 610.

At block 1350, at least one bias voltage of at least one of the first transistor and the second transistor is adjusted in a direction that reduces the differential voltage. For example, the at least one bias voltage may be adjusted by the amplifier 610. As used herein, "at least one of the first transistor and the second transistor" means the first transistor, the second transistor, or the first transistor and the second transistor.

In certain aspects, the at least one bias voltage includes at least one of a first bias voltage at a back gate (e.g., back gate 620) of the first transistor and a second bias voltage at a back gate (e.g., back gate 622) of the second transistor.

In certain aspects, the at least one bias voltage includes at least one of a first bias voltage at a gate of the first transistor and a second bias voltage at a gate of the second transistor.

In certain aspects, a first source resistor (e.g., first source resistor 630) may be coupled between the source of the first transistor and a ground, and a second source resistor (e.g., second source resistor 635) may be coupled between the source of the second transistor and the ground.

Implementation examples are described in the following numbered clauses:

1. A mixer, comprising:
   a mixing stage;
   a first transistor, wherein a gate of the first transistor is coupled to a first input of the mixer, and a drain of the first transistor is coupled to the mixing stage;
   a second transistor, wherein a gate of the second transistor is coupled to a second input of the mixer, and a drain of the second transistor is coupled to the mixing stage;
   a first source resistor coupled to a source of the first transistor;
   a second source resistor coupled to a source of the second transistor; and
   an amplifier having a first input and a second input, wherein the first input of the amplifier is coupled to the source of the first transistor, the second input of the amplifier is coupled to the source of the second transistor, and the amplifier is configured to adjust at least one bias voltage of at least one of the first transistor and the second transistor based on a differential voltage between the first input of the amplifier and the second input of the amplifier.

2. The mixer of clause 1, wherein the first source resistor is coupled between the source of the first transistor and a ground, and the second source resistor is coupled between the source of the second transistor and the ground.

3. The mixer of clause 1 or 2, wherein the amplifier has a first output and a second output, the first output of the amplifier is coupled to a back gate of the first transistor, the second output of the amplifier is coupled to a back gate of the second transistor, and the at least one bias voltage comprises a first bias voltage at the back gate of the first transistor and a second bias voltage at the back gate of the second transistor.

4. The mixer of clause 3, wherein the amplifier is configured to adjust the first bias voltage and the second bias voltage in a direction that reduces the differential voltage between the first input of the amplifier and the second input of the amplifier.

5. The mixer of clause 1 or 2, wherein the amplifier has an output coupled to a back gate of the first transistor, and the at least one bias voltage comprises a bias voltage at the back gate of the first transistor.

6. The mixer of clause 5, wherein the amplifier is configured to adjust the bias voltage in a direction that reduces the differential voltage between the first input of the amplifier and the second input of the amplifier.

7. The mixer of clause 1 or 2, wherein the amplifier has a first output and a second output, the first output of the amplifier is coupled to the gate of the first transistor, the second output of the amplifier is coupled to the gate of the second transistor, and the at least one bias voltage comprises a first bias voltage at the gate of the first transistor and a second bias voltage at the gate of the second transistor.

8. The mixer of clause 7, wherein the amplifier is configured to adjust the first bias voltage and the second bias voltage in a direction that reduces the differential voltage between the first input of the amplifier and the second input of the amplifier.

9. The mixer of clause 1 or 2, wherein the amplifier has an output coupled to the gate of the first transistor, and the at least one bias voltage comprises a bias voltage at the gate of the first transistor.

10. The mixer of clause 9, wherein the amplifier is configured to adjust the bias voltage in a direction that reduces the differential voltage between the first input of the amplifier and the second input of the amplifier.

11. The mixer of any one of clauses 1 to 10, wherein:
    the first transistor is configured to receive a first input signal via the first input of the mixer, and generate a first current based on the first input signal; and
    the second transistor is configured to receive a second input signal via the second input of the mixer, and generate a second current based on the second input signal.

12. The mixer of clause 11, wherein the mixer is configured to receive a first local oscillator (LO) signal and a second LO signal, mix the first current with the first LO signal and the second LO signal, and mix the second current with the first LO signal and the second LO signal.

13. The mixer of clause 12, wherein the first input signal comprises a first intermediate frequency (IF) signal, and the second input signal comprises a second IF signal.

14. The mixer of any one of clauses 1 to 13, wherein the mixing stage comprises:

a third transistor, wherein a drain of the third transistor is coupled to a first node, the gate of the third transistor is coupled to a third input of the mixer, and a source of the third transistor is coupled to the drain of the first transistor;

a fourth transistor, wherein a drain of the fourth transistor is coupled to a second node, the gate of the fourth transistor is coupled to a fourth input of the mixer, and a source of the fourth transistor is coupled to the drain of the first transistor;

a fifth transistor, wherein a drain of the fifth transistor is coupled to the first node, the gate of the fifth transistor is coupled to the fourth input of the mixer, and a source of the fifth transistor is coupled to the drain of the second transistor; and a sixth transistor, wherein a drain of the sixth transistor is coupled to the second node, the gate of the sixth transistor is coupled to the third input of the mixer, and a source of the sixth transistor is coupled to the drain of the second transistor.

15. The mixer of clause 14, further comprising:

a first load coupled between the first node and a supply rail; and a second load coupled between the second node and the supply rail.

16. The mixer of clause 14 or 15, wherein the third input of the mixer is configured to receive a first local oscillator (LO) signal, and the fourth input of the mixer is configured to receive a second LO signal.

17. The mixer of clause 16, wherein the first input of the mixer is configured to receive a first intermediate frequency (IF) signal, and the second input of the mixer is configured to receive a second IF signal.

18. A method of operating a mixer, wherein the mixer includes a mixing stage, a first transistor coupled to the mixing stage, and a second transistor coupled to the mixing stage, the method comprising:

generating a first current based on a first input signal using the first transistor;

generating a second current based on a second input signal using the second transistor;

mixing the first current and the second current with one or more local oscillator (LO) signals using the mixing stage;

sensing a differential voltage between a source of the first transistor and a source of the second transistor; and adjusting at least one bias voltage of at least one of the first transistor and the second transistor in a direction that reduces the differential voltage.

19. The method of clause 18, wherein the at least one bias voltage comprises at least one of a first bias voltage at a back gate of the first transistor and a second bias voltage at a back gate of the second transistor.

20. The method of clause 18, wherein the at least one bias voltage comprises at least one of a first bias voltage at a gate of the first transistor and a second bias voltage at a gate of the second transistor.

21. A mixer, comprising:

a mixing stage;

a first transistor, wherein a gate of the first transistor is coupled to a first input of the mixer, and a drain of the first transistor is coupled to the mixing stage;

a second transistor, wherein a gate of the second transistor is coupled to a second input of the mixer, and a drain of the second transistor is coupled to the mixing stage;

a first source resistor coupled to a source of the first transistor;

a second source resistor coupled to a source of the second transistor; and an amplifier having a first input, a second input, a first output, and a second output, wherein the first input of the amplifier is coupled to the source of the first transistor, the second input of the amplifier is coupled to the source of the second transistor, the first output of the amplifier is coupled to a back gate or a gate of the first transistor, and the second output of the amplifier is coupled to a back gate or a gate of the second transistor.

22. A mixer, comprising:

a mixing stage;

a first transistor, wherein a gate of the first transistor is coupled to a first input of the mixer, and a drain of the first transistor is coupled to the mixing stage;

a second transistor, wherein a gate of the second transistor is coupled to a second input of the mixer, and a drain of the second transistor is coupled to the mixing stage;

a first source resistor coupled to a source of the first transistor;

a second source resistor coupled to a source of the second transistor; and an amplifier having a first input, a second input, and an output, wherein the first input of the amplifier is coupled to the source of the first transistor, the second input of the amplifier is coupled to the source of the second transistor, and the output of the amplifier is coupled to a back gate or a gate of the first transistor.

23. A wireless device including the mixer of any one of the clauses 1 to 22, wherein the wireless device further comprises:

an antenna;

a power amplifier coupled between the mixer and the antenna.

24. The wireless device of clause 23, further comprising a transformer coupling the power amplifier to the antenna.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a direct current (DC) ground or an alternating current (AC) ground, and thus the term "ground" covers both possibilities. An AC ground may be provided by a DC voltage. As used herein, the term "approximately" means within 90 percent to 110 percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed is:

1. A mixer, comprising:

a mixing stage;

a first transistor, wherein a gate of the first transistor is coupled to a first input of the mixer, and a drain of the first transistor is coupled to the mixing stage;

a second transistor, wherein a gate of the second transistor is coupled to a second input of the mixer, and a drain of the second transistor is coupled to the mixing stage;

a first source resistor coupled to a source of the first transistor;

a second source resistor coupled to a source of the second transistor; and an amplifier having a first input, a second input, a first output, and a second output, wherein the first input of the amplifier is coupled to the source of the first transistor, the second input of the amplifier is coupled to the source of the second transistor, the first output of the amplifier is coupled to a back gate of the first transistor, the second output of the amplifier is coupled to a back gate of the second transistor, and the amplifier is configured to adjust a first bias voltage at the back gate of the first transistor and a second bias voltage at the back gate of the second transistor in a direction that reduces a differential voltage between the first input of the amplifier and the second input of the amplifier.

2. The mixer of claim 1, wherein the first source resistor is coupled between the source of the first transistor and a ground, and the second source resistor is coupled between the source of the second transistor and the ground.

3. The mixer of claim 1, wherein:

the first transistor is configured to receive a first input signal via the first input of the mixer, and generate a first current based on the first input signal; and the second transistor is configured to receive a second input signal via the second input of the mixer, and generate a second current based on the second input signal.

4. The mixer of claim 3, wherein the mixing stage is configured to receive a first local oscillator (LO) signal and a second LO signal, mix the first current with the first LO signal and the second LO signal, and mix the second current with the first LO signal and the second LO signal.

5. The mixer of claim 4, wherein the first input signal comprises a first intermediate frequency (IF) signal, and the second input signal comprises a second IF signal.

6. The mixer of claim 1, wherein the mixing stage comprises:

a third transistor, wherein a drain of the third transistor is coupled to a first node, the gate of the third transistor is coupled to a third input of the mixer, and a source of the third transistor is coupled to the drain of the first transistor;

a fourth transistor, wherein a drain of the fourth transistor is coupled to a second node, the gate of the fourth transistor is coupled to a fourth input of the mixer, and a source of the fourth transistor is coupled to the drain of the first transistor;

a fifth transistor, wherein a drain of the fifth transistor is coupled to the first node, the gate of the fifth transistor is coupled to the fourth input of the mixer, and a source of the fifth transistor is coupled to the drain of the second transistor; and a sixth transistor, wherein a drain of the sixth transistor is coupled to the second node, the gate of the sixth transistor is coupled to the third input of the mixer, and a source of the sixth transistor is coupled to the drain of the second transistor.

7. The mixer of claim 6, further comprising:

a first load coupled between the first node and a supply rail; and a second load coupled between the second node and the supply rail.

8. The mixer of claim 6, wherein the third input of the mixer is configured to receive a first local oscillator (LO) signal, and the fourth input of the mixer is configured to receive a second LO signal.

9. The mixer of claim 8, wherein the first input of the mixer is configured to receive a first intermediate frequency (IF) signal, and the second input of the mixer is configured to receive a second IF signal.

10. A method of operating a mixer, wherein the mixer includes a mixing stage, a first transistor coupled to the mixing stage, and a second transistor coupled to the mixing stage, the method comprising:

generating a first current based on a first input signal using the first transistor;

generating a second current based on a second input signal using the second transistor;

mixing the first current and the second current with one or more local oscillator (LO) signals using the mixing stage;

sensing a differential voltage between a source of the first transistor and a source of the second transistor; and adjusting a first bias voltage at a back gate of the first transistor and a second bias voltage at a back gate of the second transistor in a direction that reduces the differential voltage.

* * * * *